(12) United States Patent
Luo (10) Patent No.: US 11,201,289 B2
(45) Date of Patent: Dec. 14, 2021

(54) THERMALLY ACTIVATED DELAYED FLUORESCENCE POLYMERIC MATERIAL AND PREPARING METHOD OF SAME

(71) Applicant: Wuhan China Star Optoelectronics Semiconductor Display Technology Co., Ltd., Wuhan (CN)

(72) Inventor: Jiajia Luo, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 356 days.

(21) Appl. No.: 16/463,382

(22) PCT Filed: Dec. 28, 2018

(86) PCT No.: PCT/CN2018/125102
§ 371 (c)(1),
(2) Date: May 23, 2019

(87) PCT Pub. No.: WO2020/073527
PCT Pub. Date: Apr. 16, 2020

(65) Prior Publication Data
US 2020/0136048 A1     Apr. 30, 2020

(30) Foreign Application Priority Data

Oct. 11, 2018 (CN) .......................... 201811181588.X (51) Int. Cl.
| | | |
|---|---|---|
| *H01L 51/00* | (2006.01) |
| *C08G 73/02* | (2006.01) |
| *C09K 11/06* | (2006.01) |
| *H01L 51/50* | (2006.01) |

(52) U.S. Cl.
CPC ...... *H01L 51/0035* (2013.01); *C08G 73/0273* (2013.01); *C09K 11/06* (2013.01); *C09K 2211/1425* (2013.01); *C09K 2211/1466* (2013.01); *H01L 51/5012* (2013.01); *H01L 2251/552* (2013.01)

(58) Field of Classification Search
CPC ............ H01L 51/0035; H01L 51/5012; H01L 2251/552; C08G 73/0273; C09K 11/06; C09K 2211/1425; C09K 2211/1466
See application file for complete search history.

(56) References Cited

FOREIGN PATENT DOCUMENTS

CN         105176520      * 12/2015   ........... C07D 209/86

* cited by examiner

*Primary Examiner* — Shane Fang (57) ABSTRACT

A thermally activated delayed fluorescence (TADF) polymeric material having a molecular structure formed by a main chain of a polymerized TADF and a side chain connected to alkyl chains is provided. This structure of the TADF polymeric material has excellent TADF properties and solubility. Further, an electroluminescent device is prepared by solution processing and a good device effect is obtained.

14 Claims, 2 Drawing Sheets

HOMO

THERMALLY ACTIVATED DELAYED FLUORESCENCE POLYMERIC MATERIAL AND PREPARING METHOD OF SAME

RELATED APPLICATIONS

This application is a National Phase of PCT Patent Application No. PCT/CN2018/125102 having International filing date of Dec. 28, 2018, which claims the benefit of priority of Chinese Patent Application No. 201811181588.X filed on Oct. 11, 2018. The contents of the above applications are all incorporated by reference as if fully set forth herein in their entirety.

FIELD AND BACKGROUND OF THE INVENTION

The present invention relates to a material field of a flat display device, and more particularly, to a thermally activated delayed fluorescence polymeric material and a preparing method of the same.

It is known that organic light emitting diodes (OLEDs) have great potential in applications of optoelectronic devices in the fields of display, illumination, etc. Photoelectric conversion efficiency is one of the important parameters for evaluating OLED. Since the advent of organic light-emitting diodes, in order to improve the luminous efficiency of organic light-emitting diodes, various fluorescence-based and phosphorescence-based luminescent material systems have been developed.

Although fluorescence-based OLEDs are characterized by high stability, they are limited by the laws of quantum statistics so that the ratio of generated excitons of singlet exited state to that of triplet exited state is 1:3 under electrical activation. Therefore, internal electroluminescence quantum efficiency of the fluorescence-based material is limited to 25%.

Conversely, the phosphorescence-based material can utilize both of excitons of the singlet exited state and the triplet exited state due to its spin-orbit interaction of the heavy atoms so that the internal electroluminescence quantum efficiency can reach 100% in theory. However, the phosphorescence-based OLED material usually requires the precious metals, the cost of the product increases correspondingly and the material is not environmentally friendly.

For overcoming the disadvantages of the two materials, Adachi proposed to allow triplet excited excitons to return to the singlet excited state through thermal activation and then radiation transition back to the ground state to illuminate thereby the internal electroluminescence quantum efficiency can also reach 100% in theory. This allows high efficiency compatible to the phosphorescence OLED by using organic compounds without heavy metal atoms, as described in C. Adachi, et. al., Nature, Vol 492, 234, (2012). Most of the research currently focuses on vapor-deposited materials, but this will make the manufacturing cost of the device very high.

Further, thermally activated delayed fluorescence (TADF) materials have obvious advantages on wet-type processing because its good film formation. However, how to maintain the high photoluminescence quantum yield and the large reverse intersystem enthalpy constant of the thermally activated delayed fluorescence polymer is still not solved. This is also the reason that the device prepared by the current thermally activated delayed fluorescence polymeric materials have lower external quantum efficiency.

Even so, the thermally activated delayed fluorescence materials still attract the attention of many researchers with their unique advantages. The performance of the thermal evaporation device based on small TADF materials is comparable to that of phosphorescent heavy metal complexes. However, there are only a few of TADF materials that can be used to prepare electroluminescent devices by spin-coating, especially the TADF polymers are fewer.

It is therefore of great significance to design and synthesize a new type of TADF polymer for developing a broad application to TADF materials.

SUMMARY OF THE INVENTION

One aspect of the present invention is to provide a thermally activated delayed fluorescence (TADF) polymeric material, having excellent TADF characteristics and solubility, can be used for preparing electroluminescent devices by solution processing. Further, this polymeric material of the present invention can be applied to display devices to obtain good device effects.

It is characterized that a technical solution adopted by the present invention is as follows:

A thermally activated delayed fluorescence polymeric material, having a structural formula as follows:

It is characterized that a light emitting layer plays a leading role in an organic electroluminescent device, and the performance of light emitting materials is a key factor in determining device performance. For current small molecule doping devices, the host and guest of the light emitting layer adopt simple physical doping and inevitably the phase separation exists. The charge transfer complexes and exciplexes are easy formed thereby affecting device performance. The polymer luminescent material belongs to a luminescent system formed by a main chain as a host, and a side chain connected to luminescent guest and thus the phase separation can be effectively avoided. Meanwhile, the polymer has good thermodynamic stability and film forming, and can be used for preparing devices by a lower cost solution processing in organic electroluminescent devices.

This thermally activated delayed fluorescence polymeric material according to the present invention can emit orange light, having a molecular structure formed by a main chain of a polymerized TADF and a side chain connected to alkyl chains. This structure of the TADF polymeric material has excellent TADF properties and solubility. Correspondingly, the electroluminescent device can be prepared by solution processing and a good device effect can be obtained.

Further, in an alternative embodiment, the thermally activated delayed fluorescence polymeric material is synthesized by a monomeric compound A and a monomeric compound B, wherein the monomeric compound A and the monomeric compound B respectively have structural formula as follows:

monomeric compound A and monomeric compound B

Further, in an alternative embodiment, the thermally activated delayed fluorescence polymeric material is synthesized by the monomeric compound A and the monomeric compound B through a synthetic route as follows:

momomeric compound A monomeric compound B $$\xrightarrow{\text{Pd(OAc)}_2,\ \text{NaOt-Bu},\ \text{(tBu)}_2\text{HPBF}_4}_{\text{Tol, reflux, 40-60 hr}}$$

-continued

Further, in an alternative embodiment, the monomeric compound A is synthesized through a synthetic route as follows:

$$\xrightarrow{\text{(Ac)}_2\text{O}}_{\text{100-135° C., 20-30 hr}}$$

momomeric compound A

Further, in an alternative embodiment, the monomeric compound B is synthesized through a synthetic route as follows:

monomeric compound B

Another aspect of the present invention is to provide a preparing method of the thermally activated delayed fluorescence polymeric material, comprising the following steps of:

adding the monomeric compound A and the monomeric compound B into a high pressure reaction bottle;

adding anhydrous toluene into the high pressure reaction bottle to react for 40-60 hours under 80 to 120° C., and then cooling to room temperature, so as to obtain a reaction product;

performing a precipitation of the reaction product by using a mixed solvent of methanol and acetone to obtain a polymer product; and extracting the polymer product placed within hexane and acetone, and then drying to obtain the thermally activated delayed fluorescence polymeric material.

Further, in an alternative embodiment, the mixed solvent contains the methanol and the acetone with a mixing ratio of (7-9):1.

Further, in an alternative embodiment, a synthesis method of the monomeric compound A includes steps of:

adding 3,4-dihexyl-o-aminophenol and acetic anhydride into a reaction flask and refluxing for 20-30 hours under 100-135° C., so as to obtain a reaction solution; and pouring the reaction solution into ice water after being cooled to room temperature, filtering to obtain a solid, and then dissolving the solid in dichloromethane to be purified and isolated by a silica gel with a column chromatography to obtain the monomeric compound A.

Further, in an alternative embodiment, a synthesis method of the monomeric compound B includes steps of:

adding bromobenzaldehyde and a catalyst into a reaction flask and reacting for 20-30 hours under 100-120° C., so as to obtain a reaction solution; and pouring the reaction solution into ice water after being cooled to room temperature, extracting by dichloromethane, and combining collected organic phases, followed by being purified and isolated with a silica gel by a column chromatography to obtain the monomeric compound B.

Further, in an alternative embodiment, the catalyst includes palladium/carbon (Pd/C).

Further, an aspect of the present invention provides a display device, comprising a light emitting layer. It is characterized that the light emitting layer uses a material including the thermally activated delayed fluorescence polymeric material.

Further, the present invention relates to the thermally activated delayed fluorescence polymeric material as being an light emitting layer of an electrothermally activated delayed fluorescent device, including a glass and a conductive glass (ITO) substrate layer, a hole transport and injection layer, the light emitting layer, an electron transport layer, and a cathode layer.

Comparing with the prior art, the present invention has beneficial effects that an thermally activated delayed fluorescence polymeric material has excellent TADF property and solubility so that the electroluminescent devices can be prepared by a solution processing.

Further, the polymeric material according to the present invention is applied to a light emitting layer in an electroluminescence device, and it is understood from detection data that a good effect of the device can be obtained.

DESCRIPTION OF SPECIFIC EMBODIMENTS
OF THE INVENTION

A thermally activated delayed fluorescence polymeric material and a preparing method of the same according to the present invention are further described in detail with accompany drawings and embodiments.

One embodiment of the present invention provides a thermally activated delayed fluorescence polymeric material, having a structural formula as follows:

It is characterized that a light emitting layer plays a leading role in an organic electroluminescent device, and the performance of light emitting materials is a key factor in determining device performance. For current small molecule doping devices, the host and guest of the light emitting layer adopt simple physical doping and inevitably the phase separation exists. The charge transfer complexes and exciplexes are easily formed thereby affecting device performance. The polymer luminescent material belongs to a luminescent system formed by a main chain as a host, and a side chain connected to luminescent guest and thus the phase separation can be effectively avoided. Meanwhile, the polymer has good thermodynamic stability and film forming, and can be used for preparing devices by a lower cost solution processing.

This thermally activated delayed fluorescence polymeric material according to the present invention can emit orange light, having a molecular structure formed by a main chain of a polymerized TADF and a side chain connected to alkyl chains. This structure of the TADF polymeric material has excellent TADF properties and solubility. Correspondingly, the electroluminescent device can be prepared by solution processing and a good device effect can be obtained.

Figure 1:
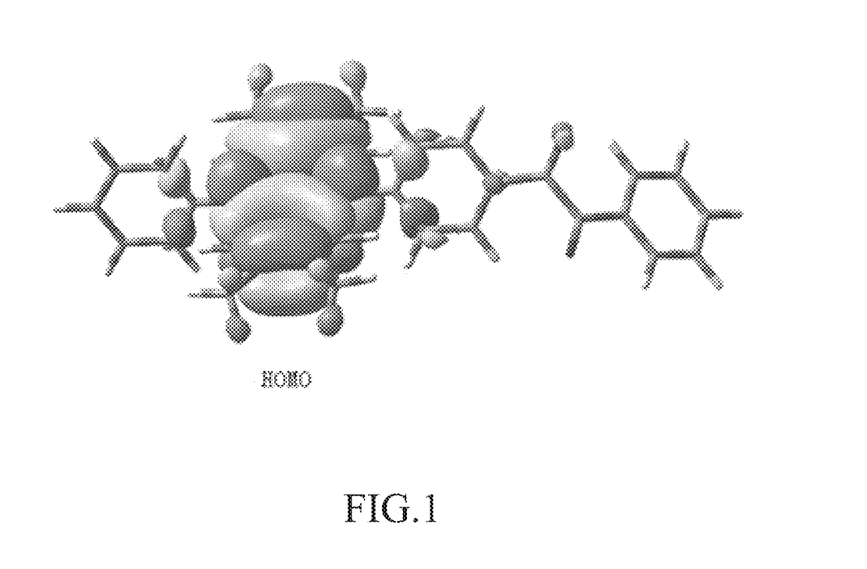
FIG. 1 is a distribution map of the highest occupied molecular orbitals (HOMO) of a thermally activated delayed fluorescence polymeric material according to one embodiment of the present invention, which is obtained by theoretically calculating.
Figure 2:
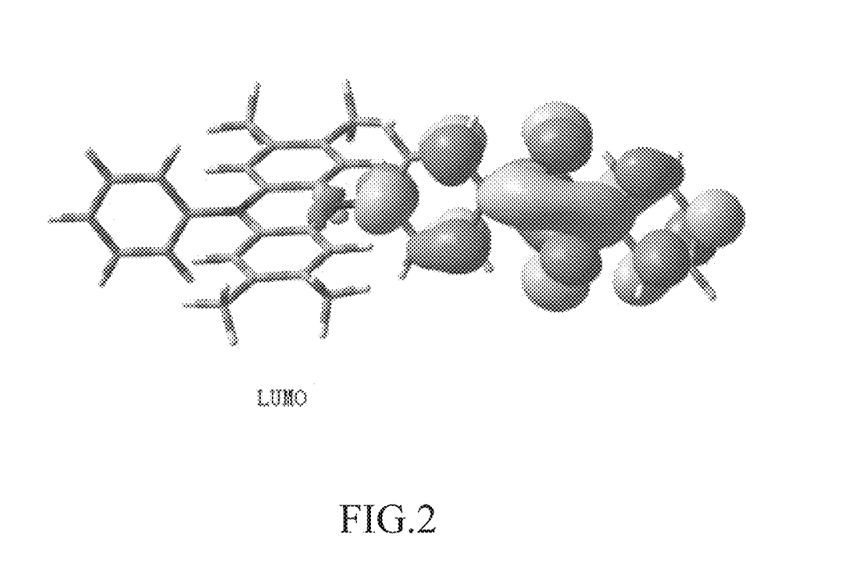
FIG. 2 is a distribution map of the lowest unoccupied molecular orbitals (LUMO) of a thermally activated delayed fluorescence polymeric material according to one embodiment of the present invention, which is obtained by theoretically calculating.

Refer to FIG. 1 and FIG. 2, which show the distribution map of the highest occupied molecular orbitals (HOMO) and the lowest unoccupied molecular orbitals (LUMO) of a thermally activated delayed fluorescence polymeric material according to the present invention, which are obtained by theoretically calculating.

Further, the electrochemical energy levels of the thermally activated delayed fluorescence polymeric material having the lowest singlet energy state (S1) and lowest triplet energy state (T1) are shown in the table below:

|  | PL Peak (nm) | S1 (eV) | T1 (eV) | EST (eV) | HOMO (eV) | LUMO (eV) |
| --- | --- | --- | --- | --- | --- | --- |
| polymer | 627 | 1.98 | 1.90 | 0.08 | −4.46 | −1.38 |

Figure 3:
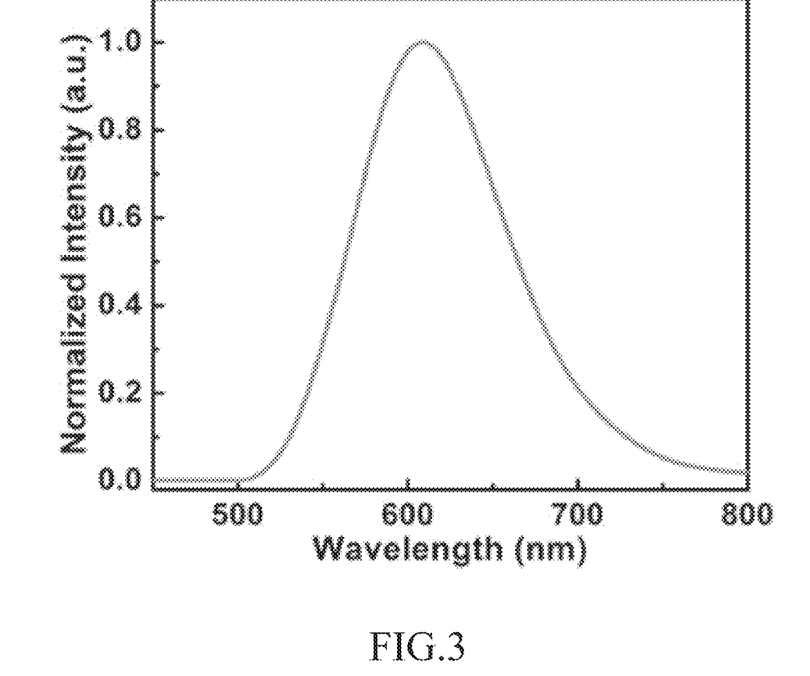
FIG. 3 is a photoluminescence spectroscopy of a thermally activated delayed fluorescence polymeric material in a film under room temperature according to one embodiment of the present invention.

Referring to FIG. 3, which shows a photoluminescence spectroscopy of a thermally activated delayed fluorescence polymeric material according to one embodiment of the present invention in a film under room temperature.

Figure 4:
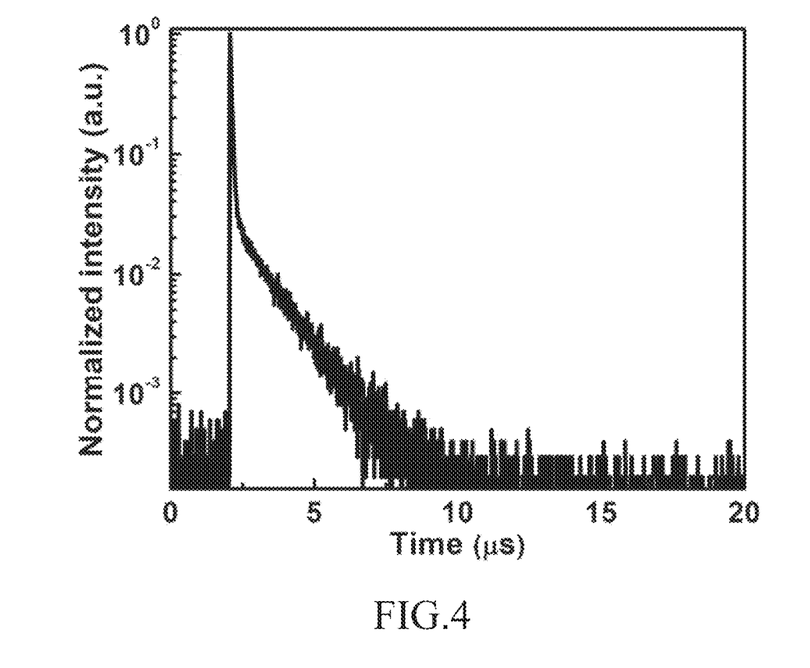
FIG. 4 is a transient photoluminescence spectroscopy of a thermally activated delayed fluorescence polymeric material in a film under room temperature according to one embodiment of the present invention.

Referring to FIG. 4, which shows a transient photoluminescence spectroscopy of a thermally activated delayed fluorescence polymeric material according to one embodiment of the present invention in the film under room temperature.

In one embodiment, the thermally activated delayed fluorescence polymeric material according the present invention is synthesized by a monomeric compound A and a monomeric compound B, wherein the monomeric compound A and the monomeric compound B respectively have structural formula as follows:

It is characterized that the monomeric compound A is synthesized through a synthetic route as follows:

monomeric compound A

Specifically, in one embodiment, the preparing method may include the following steps:

adding 3,4-dihexyl-o-aminophenol (2.77 g, 10 mmol) and acetic anhydride (50 ml) into 100 ml two-neck bottle, and then refluxing for 24 hours under 120° C.; and pouring the reaction solution into 500 ml ice water after being cooled to room temperature, filtering to obtain a grayish white solid, and then dissolving the solid in dichloromethane to be purified and isolated with a silica gel by a column chromatography (CH$_2$Cl$_2$:Hexane, v:v, 1:3) to obtain a blue white powder 2.1 g with 81% yield.

It is characterized that the monomeric compound B is obtained from the following synthetic route.

monomeric compound B

Specifically, in one embodiment, the preparing method may include the following steps:

adding p-bromobenzaldehyde (1.83 g, 10 mmol) and Pd/C (90 mg, catalytic amount) into a 100 ml two-neck bottle, and pumping to react for 24 hours under 110° C.; and pouring the reaction solution into 50 ml ice water after being cooled to room temperature, extracting by dichloromethane for 3 times, and combining collected organic phases, followed by being purified and isolated with a silica gel by a column chromatography (dichloromethane:hexane, v:v, 1:5) to obtain 1.0 g powder with light blue color and yield 55%.

After obtaining the monomeric compound A and the monomeric compound B, the thermally activated delayed fluorescence polymeric material according to the present invention can be synthesized by a synthetic route as follows:

Specifically, in one embodiment, the method includes below steps:

adding the monomeric compound A (1.04 g, 2 mmol) and the monomeric compound B (0.73 g, 0.2 mmol) into 200 ml of a high pressure reaction bottle, and purging for 3 times, adding 50 ml anhydrous toluene into the high pressure reaction bottle to react for 48 hours under 100° C.;

cooling to room temperature, and then depositing with a mixing solvent of 250 ml methanol and 30 ml acetone, followed by extracting the obtained polymer in hexane for 3 days and in acetone for 3 days, drying in vacuum to obtain 0.66 g polymer with white color floc and yield 37%.

It is characterized that the obtained polymer has a number average molecular weight of 21.3 kg/mol and a weight average molecular weight of 35.2 g/mol, and PDI is 1.65.

Further, the thermally activated delayed fluorescence polymeric material can be used for forming a light emitting layer of an electrothermally activated delayed fluorescence device.

It is characterized that the electrothermally activated delayed fluorescence device in one embodiment includes a substrate layer, a hole transport and injection layer, the light emitting layer, an electron transport layer, and a cathode layer.

Specifically, the substrate layer can be a glass and/or a conductive glass (ITO). The hole transport and injection layer can be one of (poly(3,4-ethylenedioxythiophene), polystyrene sulfonate, and PEDOT:PSS; the electron transport layer can be 1,3,5-tri(m-(3-pyrid-3-yl-phenyl)benzene (TmPyPB). The cathode layer can be LiF/Al.

Further, in a specific preparing method of the above electroluminescent device, the method may include steps of: subsequently spin-coating PESOT:PSS and the thermally activated delayed fluorescence polymeric material on a cleaned conductive glass (ITO) substrate so as to form the hole transport and injection layer and the light emitting layer, and then subsequently performing evaporation of TmPyPB, 1 nm LiF and 100 nm Al under high vacuum conditions to form the electron transport layer and the cathode layer in order.

Specifically, in one embodiment, the electroluminescent device has a structure as follows:

ITO/PEDOT:PSS (50 nm)/the polymer (40 nm)/TmPyPB (40 nm)/LiF (1 nm)/Al (100 nm).

Further, performance of the above electroluminescent device is measured, in which the properties of current-brightness-potential of the device are measured by Keithley source measurement system with a calibrated silicon photodiode (Keithley 2400 Sourcemeter, Keithley 2000 Currentmeter) and the electroluminescence spectrum is measure by French company JP SPEX CCD3000 spectrometer. All measurements are performed at room temperature in the atmosphere. The performance data of the device are shown below:

| Max. Brightness (cd/m$^2$) | Starting voltage (V) | CIE | Max. external quantum efficiency (%) |
|---|---|---|---|
| 4123 | 5.6 | (0.58, 0.36) | 11.2 |

The technical scope of the present invention is not limited to the abovementioned content. Many changes and modifications to the described embodiments can be carried out by the skilled person in the art without departing from the scope and the spirit of the invention, and the changes and modifications are intended to be limited only by the appended claims.

What is claimed is:

1. A thermally activated delayed fluorescence polymeric material, having a structural formula as follows:

wherein n is a positive integer.

2. The thermally activated delayed fluorescence polymeric material according to claim 1, wherein the thermally activated delayed fluorescence polymeric material is synthesized by a monomeric compound A and a monomeric compound B, wherein the monomeric compound A and the monomeric compound B respectively have structural formula as follows:

monomeric compound A and monomeric compound B

3. The thermally activated delayed fluorescence polymeric material according to claim 2, wherein the thermally activated delayed fluorescence polymeric material is synthesized by the monomeric compound A and the monomeric compound B through a synthetic route as follows:

momomeric compound A monomeric compound B

4. The thermally activated delayed fluorescence polymeric material according to claim 2, wherein the monomeric compound A is synthesized through a synthetic route as follows:

momomeric compound A

5. The thermally activated delayed fluorescence polymeric material according to claim 2, wherein the monomeric compound B is synthesized through a synthetic route as follows:

monomeric compound B

6. A preparing method of a thermally activated delayed fluorescence polymeric material according to claim 1, comprising the following steps of:
   adding the monomeric compound A and the monomeric compound B into a high pressure reaction bottle;
   adding anhydrous toluene into the high pressure reaction bottle to react for 40-60 hours under 80 to 120° C., and then cooling to room temperature, so as to obtain a reaction product;
   performing a precipitation of the reaction product by using a mixed solvent of methanol and acetone to obtain a polymer product; and
   extracting the polymer product placed within hexane and acetone, and then drying to obtain the thermally activated delayed fluorescence polymeric material.

7. The preparing method according to claim 6, wherein the mixed solvent contains the methanol and the acetone with a mixing ratio of (7-9):1.

8. The preparing method according to claim 6, wherein a synthesis method of the monomeric compound A includes steps of:
   adding 3,4-dihexyl-o-aminophenol and acetic anhydride into a reaction flask and refluxing for 20-30 hours under 100-135° C., so as to obtain a reaction solution; and
   pouring the reaction solution into ice water after being cooled to room temperature, filtering to obtain a solid, and then dissolving the solid in dichloromethane to be purified and isolated with a silica gel by a column chromatography to obtain the monomeric compound A.

9. The preparing method according to claim 6, wherein a synthesis method of the monomeric compound B includes steps of:
   adding bromobenzaldehyde and a catalyst into a reaction flask and reacting for 20-30 hours under 100-120° C., so as to obtain a reaction solution; and
   pouring the reaction solution into ice water after being cooled to room temperature, extracting by dichloromethane, and combining collected organic phases, followed by being purified and isolated with a silica gel by a column chromatography to obtain the monomeric compound B.

10. A display device, comprising a light emitting layer, wherein the light emitting layer uses a material including a thermally activated delayed fluorescence polymeric material according to claim 1.

11. The display device according to claim 10, wherein the thermally activated delayed fluorescence polymeric material is synthesized by a monomeric compound A and a monomeric compound B, wherein the monomeric compound A and the monomeric compound B respectively have structural formula as follows:

monomeric compound A and monomeric compound B

12. The display device according to claim 11, wherein the thermally activated delayed fluorescence polymeric material is synthesized by the monomeric compound A and the monomeric compound B through a synthetic route as follows:

-continued monomeric compound A

13. The display device according to claim 11, wherein the monomeric compound A is synthesized through a synthetic route as follows:

14. The display device according to claim 11, wherein the monomeric compound B is synthesized through a synthetic route as follows:

monomeric compound B

* * * * *